United States Patent
Ramorini et al.

(10) Patent No.: US 10,277,178 B2
(45) Date of Patent: Apr. 30, 2019

(54) TRIANGULAR-WAVE VOLTAGE GENERATOR AND CORRESPONDING CLASS-D AMPLIFIER CIRCUIT

(71) Applicant: STMicroelectronics S.r.l., Agrate Brianza (IT)

(72) Inventors: Stefano Ramorini, Arluno (IT); Germano Nicollini, Piacenza (IT); Alberto Cattani, Cislago (IT); Alessandro Gasparini, Cusano Milanino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 49 days.

(21) Appl. No.: 15/692,425

(22) Filed: Aug. 31, 2017

(65) Prior Publication Data
US 2018/0234062 A1 Aug. 16, 2018

(30) Foreign Application Priority Data
Feb. 10, 2017 (IT) .................. 102017000014710

(51) Int. Cl.
*H03K 4/06* (2006.01)
*H03F 3/217* (2006.01)
*H03F 1/02* (2006.01)

(52) U.S. Cl.
CPC ........... *H03F 3/217* (2013.01); *H03F 1/0211* (2013.01); *H03F 3/2173* (2013.01); *H03K 4/06* (2013.01);
(Continued)

(58) Field of Classification Search
CPC .. H03K 4/06; H03K 4/08; H03K 4/12; H03K 4/26; H03K 4/625; H03K 4/835; H03K 4/066
See application file for complete search history.

(56) References Cited

U.S. PATENT DOCUMENTS 3,736,528 A 5/1973 Acker et al.
3,974,365 A * 8/1976 Johnson .................. G01S 13/08
702/86
(Continued)

FOREIGN PATENT DOCUMENTS

EP 1788704 A1 5/2007
JP S522257 A 1/1977

OTHER PUBLICATIONS

IT Search Report and Written Opinion for IT Appl. No. 102017000014710 dated Oct. 12, 2017 (8 pages).
(Continued)

*Primary Examiner* — Adam D Houston
(74) *Attorney, Agent, or Firm* — Crowe & Dunlevy (57) ABSTRACT

A triangular-voltage generator has an input terminal that receives a power supply voltage and an output terminal that supplies a triangular-wave voltage having a repetition period. An operational amplifier in an integrator configuration has a first input, a second input and an output coupled to the output terminal. The second input receives a reference voltage as a function of the power supply voltage. The first input is selectively and alternately connected to the input terminal during a first half-period of the repetition period and to a reference terminal during a second half-period of the repetition period.

19 Claims, 4 Drawing Sheets

(52) U.S. Cl.
CPC ....... *H03K 4/066* (2013.01); *H03F 2200/141* (2013.01); *H03F 2200/351* (2013.01)

(56) References Cited

U.S. PATENT DOCUMENTS

| | | | | |
|---|---|---|---|---|
| 6,016,075 | A * | 1/2000 | Hamo | H03F 3/2171 330/10 |
| 6,762,645 | B1 * | 7/2004 | Grant | H03F 3/19 323/282 |
| 9,287,823 | B1 * | 3/2016 | Holzmann | H01L 29/772 |
| 2002/0149426 | A1 * | 10/2002 | Honda | H03G 3/3026 330/251 |
| 2004/0189377 | A1 * | 9/2004 | Lee | H03F 1/26 330/10 |
| 2005/0083116 | A1 * | 4/2005 | Risbo | H03F 1/52 330/10 |
| 2008/0030267 | A1 | 2/2008 | Yang | |
| 2009/0009642 | A1 * | 1/2009 | Joshi | H03F 3/082 348/301 |
| 2009/0302943 | A1 * | 12/2009 | Chen | H03F 3/2173 330/251 |
| 2011/0299247 | A1 * | 12/2011 | Zhang | H02P 6/08 361/695 |
| 2013/0038391 | A1 * | 2/2013 | Hlibowicki | H03F 1/32 330/251 |
| 2013/0063190 | A1 * | 3/2013 | Panov | H03K 4/066 327/134 |
| 2013/0223652 | A1 * | 8/2013 | Sahandiesfanjani | H03F 1/30 381/121 |
| 2014/0062596 | A1 * | 3/2014 | Glibbery | H03K 4/06 330/257 |
| 2014/0355790 | A1 * | 12/2014 | Panov | H03F 3/217 381/120 |
| 2015/0071464 | A1 * | 3/2015 | Du | H03G 3/348 381/94.5 |
| 2015/0109056 | A1 * | 4/2015 | Lesso | H03F 1/0211 330/251 |
| 2015/0244391 | A1 * | 8/2015 | Yoo | H03K 4/08 327/140 |
| 2015/0285843 | A1 * | 10/2015 | Michal | H02M 3/156 324/713 |
| 2016/0056763 | A1 * | 2/2016 | Zhao | H03B 5/24 331/111 |
| 2016/0094212 | A1 * | 3/2016 | Kordik | H03K 5/24 327/77 |
| 2017/0250662 | A1 * | 8/2017 | Cope | H03F 3/187 |
| 2018/0234062 | A1 * | 8/2018 | Ramorini | H03F 1/0211 |
| 2018/0254779 | A1 * | 9/2018 | Omran | G01D 5/24 |

OTHER PUBLICATIONS

Shkarupin V V: "Circuit Trailors Triangle Waveforms," Electronic Design, Penton Media, Cleveland, OH, US, vol. 39, No. 20, Oct. 24, 1991, pp. 109-110, XP000255088.

Berkhout, Marco: "An Integrated 200-W Class-D Audio Amplifier," IEEE Journal of Solid State Circuits, vol. 38, No. 7, 2003 (9 pages).

\* cited by examiner

TRIANGULAR-WAVE VOLTAGE GENERATOR AND CORRESPONDING CLASS-D AMPLIFIER CIRCUIT

PRIORITY CLAIM

This application claims the priority benefit of Italian Application for Patent No. 102017000014710, filed on Feb. 10, 2017, the disclosure of which is hereby incorporated by reference in its entirety to the maximum extent allowable by law.

TECHNICAL FIELD

The present invention relates to a triangular-wave voltage generator and corresponding class-D amplifier circuit.

BACKGROUND

In a known manner, class-D amplifier circuits are amplification circuits that operate by switching, usually having high efficiency and therefore being recommended for power applications.

Figure 1:
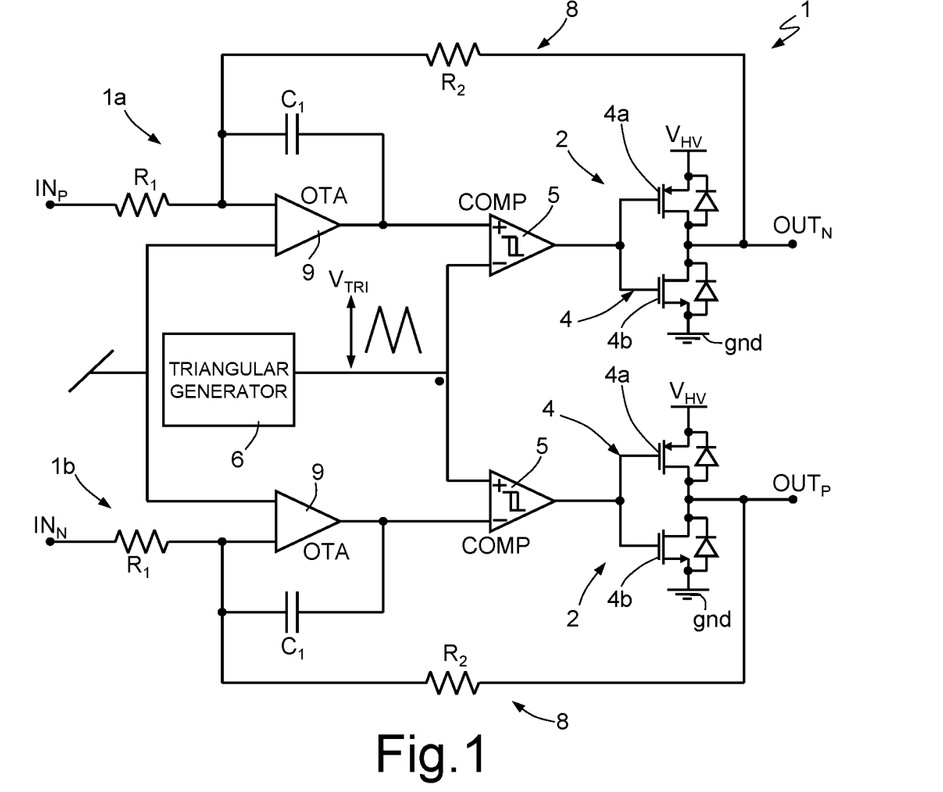
FIG. 1 shows a circuit diagram of a closed-loop class-D amplifier circuit.

FIG. 1 shows a typical configuration of a class-D amplifier circuit, indicated as a whole using reference sign 1, in this case in a differential configuration and including a first and second circuit branch 1a, 1b.

The first and second circuit branches 1a, 1b receive, respectively, a first input signal $VIN_P$ (for example positive) and a second input signal $VIN_N$ (for example negative) at first and second input terminals $IN_P$, $IN_N$, and output a first output signal (for example negative) $VOUT_N$ and a second output signal (for example positive) $VOUT_P$ at first and second output terminals $OUT_N$, $OUT_P$.

Each circuit branch 1a, 1b has an output switching circuit 2 comprising an inverter 4, in turn formed by a first MOS transistor 4a, in particular a pMOS transistor, connected between a power input $IN_{HV}$ receiving a high power supply voltage $V_{HV}$ and a respective output terminal $OUT_N$ or $OUT_P$, and a second MOS transistor 4b, in particular an nMOS transistor, connected between the respective output terminal $OUT_N$ or $OUT_P$ and a reference terminal (ground, gnd).

Each circuit branch 1a, 1b also includes a comparator circuit 5 that has an output linked to the common gate terminal of the transistors 4a, 4b and is designed to control switching of the output switching circuit 2 between the high power supply voltage $V_{HV}$ and ground. The comparator circuit 5 further includes a first comparison input (for example negative in branch 1a and positive in branch 1b), receiving a triangular-wave voltage, hereinafter simply referred to as triangular voltage, $V_{TRI}$, from a triangular-voltage generator 6. The comparator circuit 5 also includes a second comparison input (for example positive in branch 1a and negative in branch 1b).

Each circuit branch 1a, 1b also includes a feedback circuit 8, in integrator configuration, comprising an operational transconductance amplifier (OTA) 9, having a first input connected to a respective input terminal $IN_N$ or $IN_P$ via an input resistor $R_1$, a second input connected to a reference terminal, and an output connected to the second comparison input of the comparator circuit 5. In particular, an integration resistor $R_2$ is connected such as to form a closed feedback loop between the respective output terminal $OUT_P$ or $OUT_N$ and the first input of the operational transconductance amplifier 9, and an integration capacitor $C_1$ is connected between said first input and the output of the operational transconductance amplifier 9 (which is also the second comparison input of the comparator circuit 5).

In a known manner not described in detail here, the comparator circuit 5, on the basis of the triangular voltage $V_{TRI}$, determines a pulse width modulation (PWM), modifying the duty cycle of the output signal $VOUT_N$, $VOUT_P$ by varying the amplitude of the respective input signal $VIN_P$, $VIN_N$, thereby achieving operation with low power dissipation.

In a known manner and as described for example in M. Berkhout, "An integrated 200 W class-D audio amplifier", IEEE JSSC, July 2003 (incorporated by reference), in order to optimize the performance of the amplifier circuit 1, for example in terms of Power Supply Rejection Ratio (PSRR) and Total Harmonic Distortion (THD), the loop gain needs to be as high as possible, with the restriction that the Gain BandWidth Product (GBWP) be below the stability limit $f_s/\pi$, where $f_s$ is the repetition frequency of the triangular voltage $V_{TRI}$, which is equal to the inverse of the repetition period $T_s$.

Figure 2:
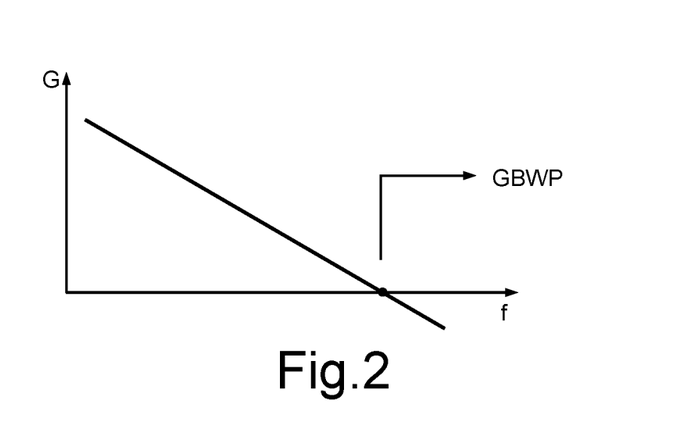
FIG. 2 is a graph of a loop gain as a function of frequency in the circuit in FIG. 1.

This requirement is illustrated in FIG. 2, which shows the evolution of the loop gain G as a function of frequency, as well as showing the gain bandwidth product GBWP.

In particular, the gain bandwidth product GBWP is defined by the expression:

$$GBWP = \frac{1}{2\pi R_2 C_1} \frac{V_{HV}}{V_{TRI}},$$

in which $V_{HV}$ and $V_{TRI}$ represent respectively the amplitude of the high power supply voltage of the output switching circuit 2 and the amplitude of the triangular voltage generated by the triangular-voltage generator 6, and $R_2$ and $C_1$ indicate, as discussed previously, the resistance and capacity of the resistor and the integration capacitor.

The process spread and temperature spread make it difficult to dimension the aforementioned gain bandwidth product GBWP such that the same is actually close to the stability limit $f_s/\pi$. In particular, a certain margin needs to be left during the design stage for said stability limit, for example 40%, to prevent said limit from being exceeded during operation.

Consequently, the actual gain bandwidth product GBWP during use may deviate substantially from the ideal limit value, with obvious repercussions in terms of the performance levels achievable by the amplifier circuit 1.

A solution that has been proposed to overcome this drawback, given the dependence of said expression of the gain bandwidth product GBWP on the amplitude of the triangular voltage $V_{TRI}$, involves designing the triangular-voltage generator 6 such that the amplitude $V_{TRI}$ is proportional to the amplitude of the high power supply voltage $V_{HV}$ and inversely proportional to the product $R_2 C_1$.

Consequently, as shown in the aforementioned expression of the gain bandwidth product GBWP, the dependence of said gain bandwidth product GBWP on the temperature and process spread can be eliminated, or in any case significantly reduced, enabling said gain bandwidth product GBWP to be set very close to the stability limit $f_s/\pi$.

Furthermore, it is desirable for the mean value of the triangular voltage $V_{TRI}$ to be constant if the comparator circuit 5 of the amplifier circuit 1 is powered by a dedicated power supply voltage $V_{DD}$, or directly proportional to the amplitude of the high power supply voltage $V_{HV}$ if said comparator circuit 5 is powered by the high power supply voltage $V_{HV}$.

Figure 3:
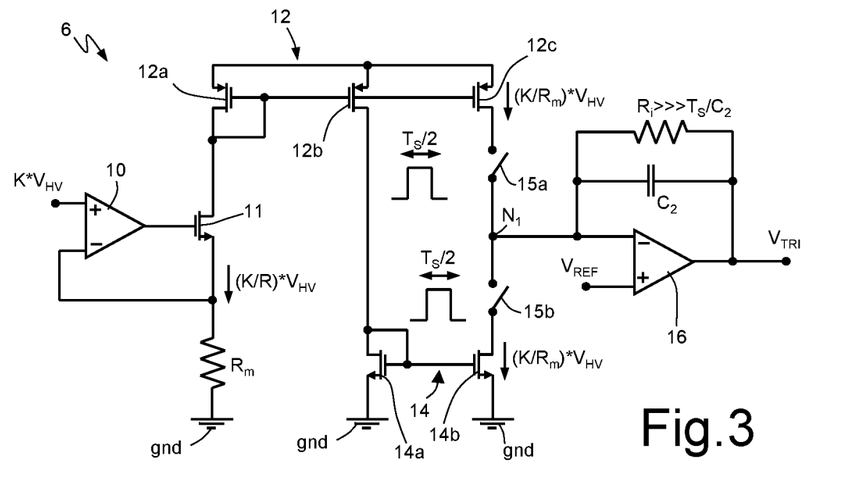
FIG. 3 is a circuit diagram of a triangular-voltage generator of a known type.

A known circuit solution for providing a triangular-voltage generator 6 that satisfies the aforementioned requirements is shown in FIG. 3.

In particular, the triangular-voltage generator, again indicated using reference sign 6, includes in this case an operational amplifier 10, in voltage follower configuration, that receives via a non-inverting input terminal a input voltage of $KV_{HV}$, i.e. equal to K times the amplitude of the high power supply voltage $V_{HV}$ (where K is less than 1), and has an inverting terminal connected to a reference terminal (ground, gnd) via a coupling resistor $R_m$, and an output terminal connected to the gate terminal of an nMOS transistor 11.

Said nMOS transistor 11 also has a source terminal connected to the inverting terminal of said operational amplifier 10 and a drain terminal connected to a first pMOS current mirror 12 comprising three pMOS transistors 12a, 12b, 12c.

The current I mirrored by the first current mirror 12 onto a respective output branch is:

$$I=(K/R_m)\cdot V_{HV},$$

where $R_m$ is the resistance of said coupling resistor.

The triangular-voltage generator 6 also includes a second nMOS current mirror 14 comprising two nMOS transistors 14a, 14b and having a respective output branch that mirrors said current I.

In particular, the output branches of the first and second current mirrors 12 are connected to an internal node $N_1$ via first and second switches 15a, 15b respectively.

The first and second switches 15a, 15b are alternately commanded to open/close in first and second semi-periods $T_s/2$ of the repetition period $T_s$, such that in a first half-period $T_s/2$ the current I is supplied to the internal node $N_1$ from the output branch of the first current mirror 12 (the first switch 15a is closed and the second switch 15b is open), and in a second half-period $T_s/2$ said current I is taken from said internal node $N_1$ from the output branch of the second current mirror 14 (the first switch 15a is open and the second switch 15b is closed).

The triangular-voltage generator 6 also includes an output integrating circuit formed by an operational amplifier 16, in integrator configuration, having a first terminal (inverting terminal) connected to said internal node $N_1$, a second terminal (non-inverting terminal) that receives a reference voltage $V_{REF}$, and an output terminal that supplies the triangular voltage $V_{TRI}$. An integration resistor $R_i$ and an integration capacitor $C_2$ are connected in parallel between the output terminal and the first terminal of the aforementioned operational amplifier 16 (the following equation being true: $R_i \ggg T_s/C_2$).

It is evident that the amplitude of the triangular voltage $V_{TRI}$ is given by:

$$V_{TRI} = kV_{HV}\frac{1}{2f_S R_m C_2},$$

and is therefore directly proportional to the amplitude of the high power supply voltage $V_{HV}$ and inversely proportional to the product $R_m C_2$.

It is therefore sufficient to ensure that the resistance and capacitance values $R_m$ and $C_2$ are matched to the respective resistance and capacitance values $R_2$ and $C_1$ of the aforementioned product $R_2 C_1$ in the expression of the gain bandwidth product GBWP of the amplifier circuit 1, such that said amplitude $V_{TRI}$ satisfies the aforementioned requirements, making said gain bandwidth product GBWP substantially independent of the process and temperature spreads.

Figure 4:
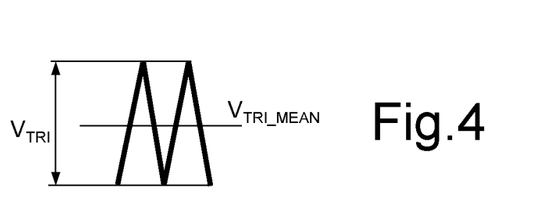
FIG. 4 is a graph of a triangular voltage generated by the generator in FIG. 3.

Furthermore, the mean value $V_{TRI\_MEAN}$ of the triangular voltage $V_{TRI}$ (see also FIG. 4) is equal to the value of the reference voltage $V_{REF}$, which may be constant, if the comparator circuit 5 of the amplifier circuit 1 is powered by the dedicated power supply voltage $V_{DD}$, or made equal to $V_{HV}/2$ if said comparator circuit 5 is powered by said high power supply voltage $V_H$.

The inventors further note that the aforementioned triangular-voltage generator 6, although it enables the aforementioned requirements relating to the amplitude of the triangular voltage $V_{TRI}$ to be satisfied, as discussed, it has some drawbacks.

In particular, this implementation includes numerous noise contributors, due for example to the coupling resistor $R_m$, the operational amplifiers 10, 16 and the MOS transistors of the first and second current mirrors 12, 14.

There are also numerous mismatch and offset factors. Indeed, the offset of the operational amplifier 10 is converted directly into an offset of the mirrored current I, resulting in a corresponding variation in the amplitude of the output voltage. Mismatches in the nMOS and pMOS transistors of the first and second current mirrors 12, 14 create an asymmetry between the leading and trailing edges of the waveform of the output triangular voltage $V_{TRI}$, thereby creating a variation both in the amplitude and in the mean value of said triangular voltage $V_{TRI}$. The repetition frequency $f_s$ imposes a limit relating to the area of the nMOS and pMOS transistors, for example a high value of said repetition frequency $f_s$ results in a reduced area of said nMOS and pMOS transistors, resulting in high offset and noise values. It is also difficult to create an effective balancing network, which needs to provide three different trimming contributions for the adaptation resistor $R_m$, for the first current mirror 12 and for the second current mirror 14.

This creates a clear need for a triangular generator, in particular for the amplifier circuit 1, that is able to satisfy the requirements relating to the amplitude of the triangular voltage $V_{TRI}$, without thereby degrading the performance of said amplifier circuit 1, for example in terms of noise and offset.

There is a need in the art to address this requirement.

SUMMARY

In an embodiment, a triangular-voltage generator for a class-D amplifier circuit has an input terminal designed to receive a first power supply voltage and an output terminal designed to supply a triangular-wave voltage having a repetition period, and includes an operational amplifier in integrator configuration having a first input, a second input and an output coupled to said output terminal. The second input is designed to receive a reference voltage, as a function of said first power supply voltage. The first input is designed to be selectively and alternately connected to said input terminal during a first half-period of said repetition period, via a first resistor element, and to a reference terminal during a second half-period of said repetition period, via a second resistor element.

In an embodiment, a Class-D amplifier circuit comprises: at least one signal input configured to receive an input signal; at least one output configured to provide an amplified output signal; an output switching circuit powered between a first power supply voltage and a reference voltage, said output switching circuit configured to provide said amplified output signal; a feedback circuit in an integrator configuration that connected between said signal output and said signal input; a comparator circuit configured to control said output switching circuit, said comparator circuit having a first comparison input coupled to said feedback circuit and a second comparison input connected to receive a triangular-wave voltage having a repetition period; and a triangular-voltage generator.

The triangular-voltage generator comprises: an input terminal configured to receive the first power supply voltage; an output terminal configured to supply the triangular-wave voltage; a first operational amplifier in an integrator configuration having: a first input configured to be selectively and alternately connected to said input terminal during a first half-period of said repetition period, via a first resistor element, and to a reference terminal during a second half-period of said repetition period, via a second resistor element; a second input configured to receive a reference voltage; and an output coupled to said output terminal.

In an embodiment, a triangular-voltage generator comprises: an operational amplifier having a first input, a second input and an output that produces a triangular wave signal; a first resistor and first switch connected in series between the first input and a supply voltage node; a second resistor and second switch connected in series between the first input and a ground voltage node; a third resistor and capacitor connected in parallel between the output and the first input; a voltage divider coupled between the supply voltage node and ground voltage node and configured to generate a divided voltage applied to the second input of the operational amplifier; wherein the first switch is actuated during a first half-period of said repetition period and the second switch is actuated during a second half-period of said repetition period.

BRIEF DESCRIPTION OF THE DRAWINGS

The present invention is further described below with reference to preferred embodiments of same, which are provided purely as non-limiting examples, and to the attached drawings, in which.

DETAILED DESCRIPTION

Figure 5:
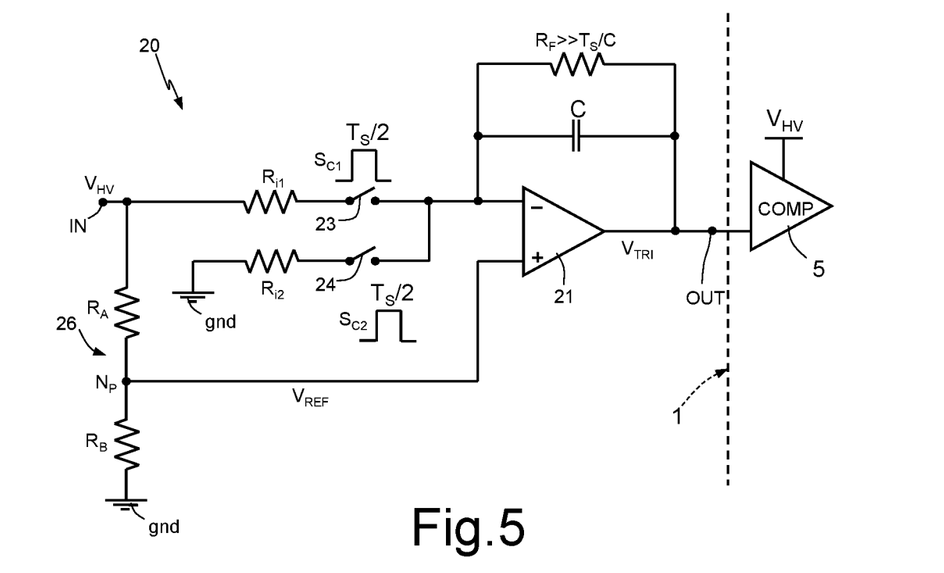
FIG. 5 is a circuit diagram of a triangular-voltage generator according to a first embodiment of the present solution.

FIG. 5 shows a triangular-voltage generator, in this case indicated using reference sign 20, according to a first embodiment of the present solution. This triangular-voltage generator 20 may, for example, be used in the class-D amplifier circuit 1 described previously and shown in FIG. 1, to provide the triangular voltage $V_{TRI}$ to the input of the comparator circuit 5, enabling the PWM modulation of the output signal generated.

The triangular-voltage generator 20 has an input terminal IN receiving the high power supply voltage V and an output terminal OUT that supplies the triangular voltage $V_{TRI}$.

As described above, the output terminal OUT is designed to be coupled electrically to the comparator circuit 5 of the amplifier circuit 1, in particular to the related first comparison input. In particular, this generator 20 is applied advantageously where said comparator circuit 5 is powered by the high power supply voltage $V_{HV}$.

In detail, the triangular-voltage generator 20 includes an operational amplifier 21, in integrator configuration, having a first input (inverting), a second input (non-inverting), and an output that supplies the triangular voltage $V_{TRI}$ at the output terminal OUT. An integration resistor $R_F$ and an integration capacitor C are connected in parallel between the output and the first input of the aforementioned operational amplifier 21 (the following equation being true: $R_F \gg T_S/C$, where $T_S$ again represents the repetition period of the triangular voltage $V_{TRI}$).

The first input of the operational amplifier 21 is selectively couplable to the input terminal IN of the voltage generator 20, via a first switch 23 and a first input resistor $R_{i1}$. The first input resistor $R_{i1}$ and the first switch 23 are connected in series between the aforementioned input terminal IN and the first input of the operational amplifier 21. The first switch 23 is controlled by a first square-wave control signal $S_{c1}$ with a period equal to the repetition period $T_S$ and a duty cycle equal to $T_S/2$.

Said first input of the operational amplifier 21 is also selectively couplable to a reference terminal (ground, gnd) of the voltage generator 20 by means of a second switch 24 and a second input resistor $R_{i2}$. The second input resistor $R_{i2}$ and the second switch 24 are connected in series between the aforementioned reference terminal (ground, gnd) and the first input of the operational amplifier 21. The second switch 24 is controlled by a second square-wave control signal $S_{c2}$ with a period equal to the repetition period $T_S$ and a duty cycle equal to $T_S/2$. In particular, the first and second control signals $S_{c1}$, $S_{c2}$ are in antiphase, i.e. the first control signal $S_{c1}$ is active in a first half-period $T_S/2$, while the second control signal $S_{c2}$ is active in the second half-period $T_S/2$ of the repetition period $T_S$.

The first input of the operational amplifier 21 is therefore selectively and alternately connected to the input terminal IN (in a first half-period $T_S/2$ of the repetition period $T_S$), or to the reference terminal (in a second half-period $T_S/2$ of the same repetition period $T_S$).

The voltage generator 20 also includes a divider circuit 26 formed by first and second divider resistors $R_A$, $R_B$ connected in series between the input terminal IN and the reference terminal (ground, gnd), together forming an internal dividing node $N_P$.

In particular, the second input of the operational amplifier 21 is connected to the aforementioned internal dividing node $N_P$ and receives a reference voltage $V_{REF}$.

It is evident that the aforementioned reference voltage $V_{REF}$ is given by the following expression:

$V_{REF} = V_{HV}/k$, where k is the division factor of the divider circuit 26, which is in turn given by:

$k=(R_A+R_B)/R_B.$

Moreover, the reference voltage $V_{REF}$ is the mean value $V_{TRI\_MEAN}$ of the triangular voltage $V_{TRI}$.

When in use, the first and second switches 23, 24 are alternately commanded to open/close in the first and second semi-periods $T_s/2$ of the repetition period $T_s$, such that in a first half-period $T_s/2$ a charging current is supplied at the first input of the operational amplifier 21 via the first input resistor $R_{i1}$ (the first switch 23 is closed and the second switch 24 is open), and in the second half-period $T_s/2$ a discharge current is extracted from said first input of the operational amplifier 21 via the second resistor $R_{i2}$ (the first switch 23 is open and the second switch 24 is closed).

In steady state, the following equality relation is satisfied between the charging and discharge currents, both of which are equal to an integration current I:

$$\frac{V_{HV}(1-1/k)}{R_{i1}} = \frac{V_{HV}}{kR_{i2}},$$

from which the following can be derived:

$R_{i1}=(k-1)\cdot R_{i2}.$

If this relation is satisfied, it is easy to demonstrate that the amplitude of the triangular voltage $V_{TRI}$ is given by:

$$V_{TRI} = \frac{V_{HV}}{k} \frac{1}{2f_s R_{i2} C},$$

and is therefore proportional to the amplitude of the high power supply voltage $V_{HV}$ and inversely proportional to the product $R_{i2}C$.

It is therefore sufficient to ensure that the resistance and capacitance values $R_{i2}$ and C are matched to the respective resistance and capacitance values $R_2$ and $C_1$ of the product $R_2C_1$ in the expression of the gain bandwidth product GBWP of the amplifier circuit 1 (see discussion above), such that the amplitude $V_{TRI}$ satisfies the aforementioned requirements, making the gain bandwidth product GBWP of the amplifier circuit 1 substantially independent of the process and temperature spreads.

Furthermore, the mean value $V_{TRI\_MEAN}$ of the triangular voltage $V_{TRI}$ is equal to $V_{HV}/k$. With k=2, this mean value is perfectly centered in relation to the dynamic (0-$V_{HV}$) of the comparator circuit 5 of the amplifier circuit 1

A triangular-voltage generator according to a second embodiment of the present solution, is described below with reference to FIG. 6, and is also indicated using reference sign 20. This embodiment is advantageously used where the comparator circuit 5 of the amplifier circuit 1 is powered by the dedicated power supply voltage $V_{DD}$, having a different value, in particular a lesser value, than the high power supply voltage $V_{HV}$.

Figure 6:
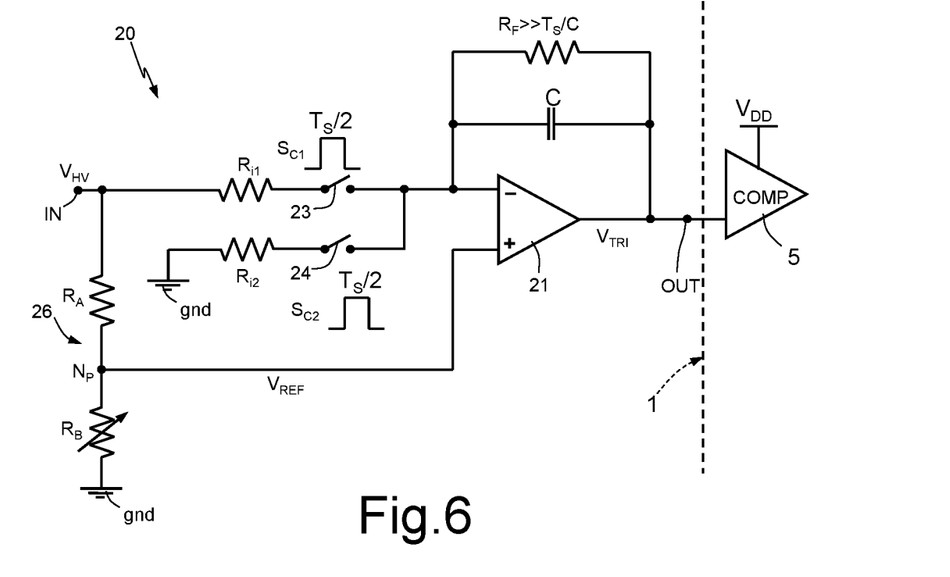
FIG. 6 is a circuit diagram of a triangular-voltage generator, according to a second embodiment of the present solution.

The triangular-voltage generator 20 of FIG. 6 differs from the solution described above with FIG. 5 in that the division factor k is variable and obtained for example by introducing a variable resistance for the second divider resistor $R_B$.

In this embodiment, it is in fact necessary for the triangular voltage $V_{TRI}$ to adapt to the input dynamic of the comparator circuit 5, limited to the range 0-$V_{DD}$. The variation in the division factor k (in this case by varying the resistance of the second divider resistor $R_B$) makes it possible to maintain the mean value of the triangular voltage $V_{TRI\_MEAN}$ (again given by $V_{HV}/k$) around the value $V_{DD}/2$, regardless of the amplitude value of the dedicated power supply voltage $V_{DD}$.

The variation of the division factor k nonetheless results in a modification of the amplitude of the triangular voltage $V_{TRI}$ (not just of the mean value of same). Advantageously, the configuration described determines that the effect (or sensitivity) of variation on the mean value of the triangular voltage $V_{TRI\_MEAN}$ is large, such as to be adaptable to the spread of the dedicated power supply voltage value $V_{DD}$, and simultaneously to determine that the effect of variation on the amplitude of said triangular voltage $V_{TRI}$ is minimal (or that the amplitude of the triangular voltage $V_{TRI}$ is substantially insensitive to the variation in the division factor k).

In particular, modifying the division factor k by a factor $\Delta k$ changes the reference voltage $V_{REF}$ accordingly by a factor $\Delta V_{REF}$.

It can be shown that, as a result of such modification, the following expressions are true, identifying the corresponding modification of the mean value $V_{TRI\_MEAN}$ and of the amplitude $V_{TRI}$ of the triangular voltage:

$$\Delta V_{TRI\_MEAN} = 1 + \frac{1}{2}R_F\left(\frac{1}{R_{1i}} + \frac{1}{R_{i2}}\right)\Delta V_{REF}, \text{ and}$$

$$\Delta V_{TRI} = \frac{1}{4f_s R_{i2} C} \frac{k-2}{k-1} \Delta V_{REF}.$$

Bearing in mind that, as discussed above, the amplitude of the triangular voltage $V_{TRI}$ is in this case given by:

$$V_{TRI} = \frac{V_{HV}}{k} \frac{1}{2f_s R_{i2} C},$$

and that the mean value of said triangular voltage is equal to $V_{TRI\_MEAN}=V_{HV}/k$, the aforementioned expressions can be rewritten as follows:

$$\Delta V_{TRI\_MEAN} = 1 + \frac{1}{2}\frac{R_F}{R_{i2}}\frac{k}{k-1}\Delta V_{REF} = G_{MEAN} \cdot \Delta V_{REF} \text{ and}$$

$$\Delta V_{TRI} = \frac{1}{2}\frac{V_{TRI}}{V_{TRI\_MEAN}}\frac{k-2}{k-1}\Delta V_{REF} = G_{AMP} \cdot \Delta V_{REF},$$

in which $G_{MEAN}$ represents the gain associated with the mean value $V_{TRI\_MEAN}$ and $G_{AMP}$ represents the gain associated with the amplitude of said triangular voltage $V_{TRI}$, as a function of the division factor k.

In particular, given that the amplitude $V_{TRI}$ and the mean value $V_{TRI\_MEAN}$ of the triangular voltage can have a fixed value, once the dedicated power supply voltage $V_{DD}$ is known, the aforementioned variations $\Delta V_{TRI\_MEAN}$ and $\Delta V_{TRI}$ then depend only on the division factor k.

Figure 7:
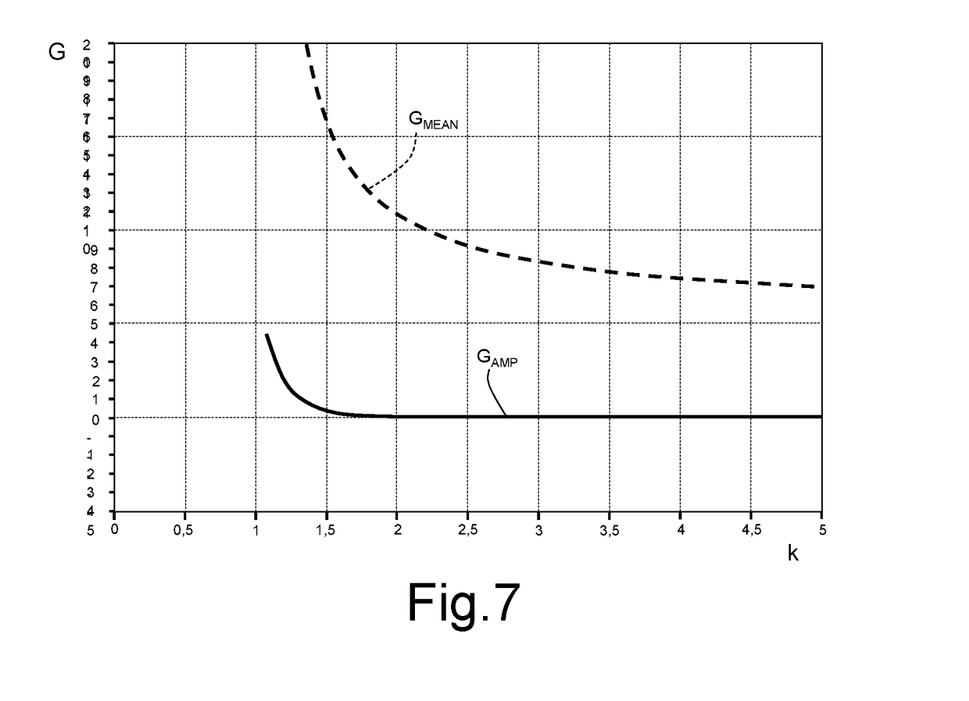
FIG. 7 is a graph showing the gain performance of the generator in FIG. 6.

As shown in FIG. 7, advantageously, for division factor values k that are greater than a given threshold, for example 1.5 (k≥1.5), the evolution of the amplitude gain, $G_{AMP}$, is substantially constant in relation to the division factor k, while the evolution of the mean-value gain, $G_{MEAN}$, varies widely in relation to said division factor k.

As sought after, the solution described therefore makes it possible, by modifying the division factor k (in this example by varying the resistance of the second divider resistor $R_B$), to desirably vary the mean value of the triangular voltage $V_{TRI\_MEAN}$, without substantially modifying the amplitude of said triangular voltage $V_{TRI}$.

Said amplitude can therefore be appropriately dimensioned to satisfy the requirements for obtaining a gain bandwidth product GBWP that is substantially constant, while exploiting the variability of the mean value of the triangular voltage $V_{TRI\_MEAN}$ to adapt to the variable dynamic of the comparator circuit 5 of the amplifier circuit 1.

It can be shown that the variation ("trimming") of the resistance value of the second divider resistor $R_B$ can also help to reduce or eliminate the offset of the amplifier circuit 1, improving precision in the generation of the triangular voltage $V_{TRI}$.

The advantages of the solution proposed are clear from the above description.

In any case, it is emphasized that the triangular-voltage generator 20 described above makes it possible to:

provide a substantially constant gain bandwidth product GBWP, regardless of process and/or temperature variations, thereby maximizing the performance of a related class-D amplifier circuit, for example in terms of PSRR and THD, limit noise generation, since the only noise contributors are associated with resistor elements ($R_A$, $R_B$, $R_{i1}$, $R_{i2}$), in the absence of transistors and current mirrors, limit offset generation, given that only the operational amplifier 21 contributes to offset (in the absence of transistors and current mirrors) and that the variability in the division factor k can be used to further limit said offset, improve linearity, given that the charging and discharge currents are determined by resistors, which provide better linearity than transistors, for example, and improve sensitivity, given that the division ratio k can be varied to adapt to any possible power supply voltage of the comparator circuit.

It is evident that modifications and variations may be made to the subject matter described and illustrated without thereby moving outside the scope of protection of the present invention, as defined in the attached claims.

In particular, the variation of the division factor k in the second embodiment could applied be achieved similarly by varying the resistance of the first divider resistor $R_A$ of the divider circuit 26.

Figure 8:
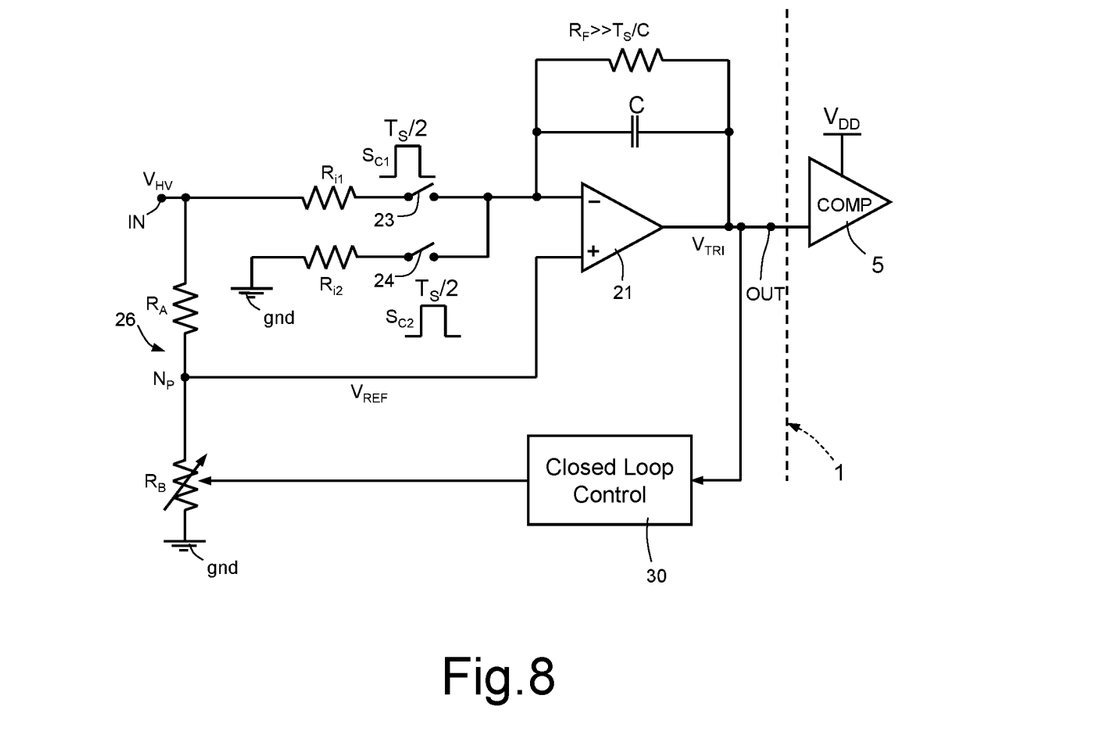
FIG. 8 shows another variant embodiment of the triangular-voltage generator according to the present solution.

Furthermore, as illustrated in FIG. 8, a closed-loop control circuit 30 may be advantageously implemented, again in the second embodiment described, to measure the mean value of the triangular voltage $V_{TRI\_MEAN}$ and, on the basis of said measurement regarding the current value of the dedicated power supply voltage $V_{DD}$, to appropriately adjust the resistance $R_B$, in order to implement dynamic control (in real time) of the mean value $V_{TRI\_MEAN}$ of the triangular voltage $V_{TRI\_MEAN}$ without however changing the amplitude of same.

The invention claimed is:

1. A triangular-voltage generator, comprising:
an input terminal configured to receive a first power supply voltage;
an output terminal configured to supply a triangular-wave voltage having a repetition period;
an operational amplifier in an integrator configuration having:
a first input configured to be selectively and alternately connected to said input terminal during a first half-period of said repetition period, via a first resistor element, and to a reference terminal during a second half-period of said repetition period, via a second resistor element;
a second input configured to receive a reference voltage; and
an output coupled to said output terminal.

2. The generator according to claim 1, wherein the operational amplifier in the integrator configuration includes an integration capacitor connected between said output of said operational amplifier and said first input of said operational amplifier, said integration capacitor configured to be charged by a charging current during said first half-period and discharged by a discharge current during said second half-period.

3. The generator according to claim 2, wherein an amplitude of said triangular-wave voltage is proportional to an amplitude of said first power supply voltage and inversely proportional to a product of a capacitance of said integration capacitor and a resistance of said second resistor element.

4. The generator according to claim 1, further comprising:
a first switching element connected between said first input and said first resistor element and controlled to close during said first half-period and to open during said second half-period; and
a second switching element connected between said first input and said second resistor element and controlled to open during said first half-period and to close during said second semi-period.

5. The generator according to claim 2, wherein the operational amplifier in the integrator configuration further comprises an integration resistor connected between said output and said first input of said operational amplifier, said integration resistor having a resistance value that is greater than a ratio between said repetition period and the capacitance of said integration capacitor.

6. The generator according to claim 1, further comprising a resistive divider coupled to said input terminal and configured to generate said reference voltage as a division, of a division factor, of said first power supply voltage.

7. The generator according to claim 6, in which the following expression is true:

$$R_{i1}=(k-1)\cdot R_{i2}$$

where $R_{i1}$ is a resistance of said first resistor element, $R_{i2}$ is a resistance of said second resistor element, and k is said division factor.

8. The generator according to claim 6, wherein the division factor of said resistive divider is variable by a variability factor that defines a corresponding variation of said reference voltage.

9. The generator according to claim 8, wherein said resistive divider includes a first divider resistor connected between said input terminal and a dividing node that is coupled to said second input of said operational amplifier, and a second divider resistor connected between said dividing node and said reference terminal; and wherein a resistance of said second divider resistor is a variable resistance such as to define said variability factor of said division factor.

10. The generator according to claim 8, wherein variation of said division factor is determines a variation of a mean value and a substantial invariability of the amplitude of said triangular wave.

11. The generator according to claim 10, wherein said division factor is equal to or greater than 1.5.

12. The generator according to claim 8, further comprising a control circuit configured to measure a mean value of the triangular-wave voltage and determine the variability factor of said division factor as a function of the measured mean value.

13. A Class-D amplifier circuit, comprising:
   at least one signal input configured to receive an input signal;
   at least one output configured to provide an amplified output signal;
   an output switching circuit powered between a first power supply voltage and a reference voltage, said output switching circuit configured to provide said amplified output signal;
   a feedback circuit in an integrator configuration that connected between said signal output and said signal input;
   a comparator circuit configured to control said output switching circuit, said comparator circuit having a first comparison input coupled to said feedback circuit and a second comparison input connected to receive a triangular-wave voltage having a repetition period; and
   a triangular-voltage generator comprising:
      an input terminal configured to receive the first power supply voltage;
      an output terminal configured to supply the triangular-wave voltage;
      a first operational amplifier in an integrator configuration having:
         a first input configured to be selectively and alternately connected to said input terminal during a first half-period of said repetition period, via a first resistor element, and to a reference terminal during a second half-period of said repetition period, via a second resistor element;
         a second input configured to receive a reference voltage; and
         an output coupled to said output terminal.

14. The circuit according to claim 13, wherein said feedback circuit includes:
   a second operational amplifier having an input connected to said signal input and an output connected to the first comparison input of the comparator circuit;
   a respective integration resistor connected to form a closed feedback loop between said signal output and said input of the second operational amplifier; and
   a respective integration capacitor connected between said input and said output of said second operational amplifier;
   wherein a gain bandwidth product of said amplifier circuit is proportional to an amplitude of said first power supply voltage and inversely proportional to a product of a capacitance of said respective integration capacitor and a resistance of said respective integration resistor.

15. The circuit according to claim 13, wherein said comparator circuit is powered by said first power supply voltage.

16. The circuit according to claim 13, wherein said comparator circuit is powered by a dedicated power supply voltage with an amplitude less than the amplitude of said first power supply voltage; and wherein said triangular-voltage generator further includes a resistive divider circuit coupled to said input terminal and configured to generate said reference voltage as a division of said first power supply voltage with a division factor having a variable value such as to maintain a mean value of said triangular-wave voltage about a value equal to a half-amplitude of said dedicated power supply voltage.

17. A triangular-voltage generator, comprising:
   an operational amplifier having a first input, a second input and an output that produces a triangular wave signal;
   a first resistor and first switch connected in series between the first input and a supply voltage node;
   a second resistor and second switch connected in series between the first input and a ground voltage node;
   a third resistor and capacitor connected in parallel between the output and the first input;
   a voltage divider coupled between the supply voltage node and ground voltage node and configured to generate a divided voltage applied to the second input of the operational amplifier;
   wherein the first switch is actuated during a first half-period of said repetition period and the second switch is actuated during a second half-period of said repetition period.

18. The generator of claim 17, wherein said voltage divider includes a variable resistance.

19. The generator of claim 18, further comprising a control circuit configured to control setting of the variable resistance in response to a mean voltage of the triangular wave signal.

* * * * *